United States Patent [19]

Johnson

[11] Patent Number: 4,523,110
[45] Date of Patent: Jun. 11, 1985

[54] MOSFET SENSE AMPLIFIER CIRCUIT
[75] Inventor: Mark G. Johnson, Dallas, Tex.
[73] Assignee: Mostek Corporation, Carrollton, Tex.
[21] Appl. No.: 537,916
[22] Filed: Sep. 30, 1983
[51] Int. Cl.³ .......................... H03K 5/24; G11C 7/06
[52] U.S. Cl. ..................................... 307/530; 365/208; 307/279; 307/585; 307/355
[58] Field of Search ............... 307/530, 355, 356, 471, 307/279, 288, 584, 585; 365/190, 207, 208

[56] References Cited

U.S. PATENT DOCUMENTS

| 2,946,897 | 7/1960 | Mayo | 307/471 X |
| 3,646,332 | 2/1972 | Suzuki | 307/471 X |
| 4,169,233 | 9/1979 | Haraszti | 307/279 X |
| 4,318,015 | 3/1982 | Schade, Jr. | 307/279 X |
| 4,365,316 | 12/1982 | Iwahashi et al. | 307/449 X |
| 4,415,995 | 11/1983 | Glock | 307/530 X |

FOREIGN PATENT DOCUMENTS 883968 11/1981 U.S.S.R. ............................. 307/530

OTHER PUBLICATIONS

Wong et al., "A 45ns Fully-Static 16K MOS ROM"; 1981 IEEE-ISSCC; 2/19/81; Dig. of Technical Papers, pp. 150-151.

Primary Examiner—Larry N. Anagnos
Attorney, Agent, or Firm—Eric W. Petraske

[57] ABSTRACT

A MOSFET sense amplifier applies both input signals to both input transistors of a common-gate sense amplifier; each input signal being applied to the source of one input transistor and the gate of the other, thereby effectively doubling the applied input signal.

5 Claims, 4 Drawing Figures

MOSFET SENSE AMPLIFIER CIRCUIT

TECHNICAL FIELD

The field of the invention is that of electronic circuit design; in particular, sense amplifier circuits applicable to MOS memories.

BACKGROUND ART

U.S. Pat. No. 3,967,252, issued to R. Donnelly on June 29, 1976, illustrates a sense amplifier for a random access memory that employs a pair of single-ended common-gate amplifier stages. This amplifier suffers from the drawback that, if the common-mode input voltage is different from a fixed reference potential, the gain and delay of the amplifier are significantly degraded.

DISCLOSURE OF THE INVENTION

The invention relates to an integrated circuit sense amplifier, in which the use of a pair of common-gate amplifier stages connected in a differential configuration eliminates the common-mode voltage sensitivity of the prior art and increases the stage gain by approximately a factor of two.

A feature of the invention is the application of both input signals to the gate and source of both input transistors.

BEST MODE FOR CARRYING OUT THE INVENTION

Figure 1:
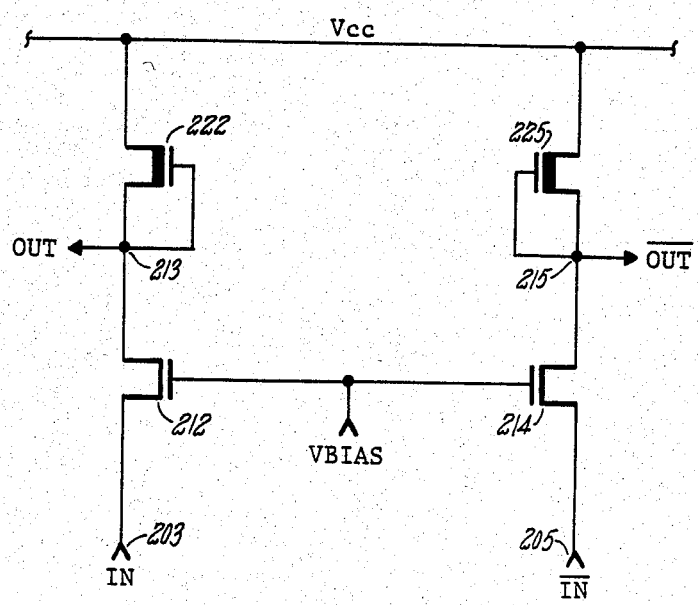
FIG. 1 illustrates a portion of a prior art circuit.

Some features of the prior art can be shown in FIG. 1, in which transistors 212 and 214 are common-gate amplifiers that respond to voltage fluctuations on the column input lines IN and $\overline{IN}$. The high capacitance of the relatively long column lines quickly drives the output nodes 213 and 215, achieving a fast response. Transistors 222 and 225 function as resistors to bias the operation of the amplifying transistors 212 and 214. This circuit exploits the fast response that may be achieved by using the high capacitance of the column lines to drive the low capacitance of nodes 213, 215, but does not exploit the possibilites of using the differential nature of the input. It also suffers from a drawback in that the performance is seriously degraded if the common-mode voltage of the input signals IN and $\overline{IN}$ differs from a fixed reference potential equal to VBIAS minus the threshold voltage of transistors 212, 214.

Figure 2:
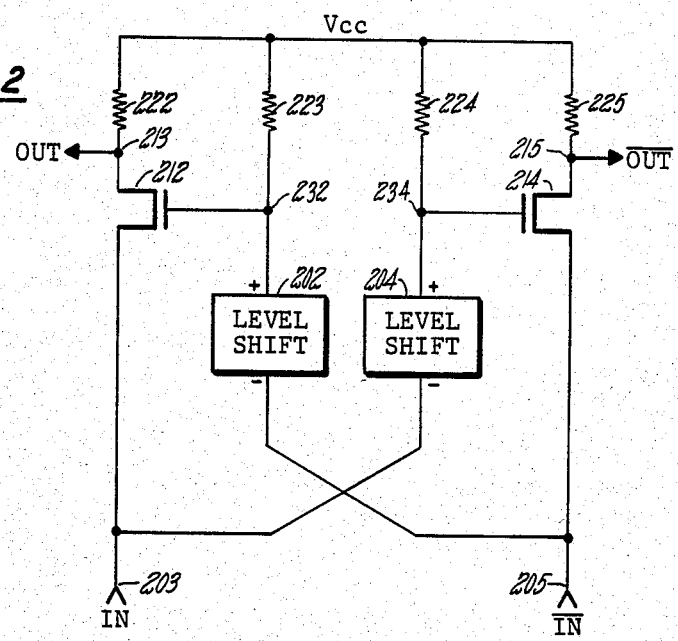
FIG. 2 illustrates an embodiment of the invention.

The invention may be illustrated with respect to a simplified form as in FIG. 2, in which column lines 203 and 205 carry the IN and $\overline{IN}$ signals respectively. Input 203 is connected to the source of amplifying transistor 212 and also to one terminal of level-shifting network 204. This network serves to offset the DC voltage of node 234 upward, such that the fluctuations on input 203 will be passed to node 234 at a higher DC bias level. The network may be a pn junction diode, a transistor with its gate connected to its drain, or any of a number of equivalent circuits known to those skilled in the art. Thus, input 203 is connected to both the source of one transistor and, by means of level shift network 204, to the gate of the other transistor. Similarly, input 205 is connected to the source of transistor 214 and to the gate of transistor 212.

Since input 203 and input 205 will move in opposite directions when a signal change is occurring, the change in the gate to source voltage on the two amplifying transistors 212 and 214 is twice the magnitude of the change in each column line. The applied input signal to the two common gate amplifiers 212 and 214, then, is effectively doubled by taking advantage of the differential nature of the input signals.

The outputs are taken from nodes 213 and 215, which are the connections between the amplifying transistors and their corresponding load resistors 222 and 225. Bias current for level shift networks 202 and 204 is supplied by resistors 223 and 224, respectively. Because the gate-to-source voltage of transistors 212 and 214 is set by the level shift networks and not by the common-mode input voltage, circuit performance is largely insensitive to common-mode voltage over a wide range. As long as the larger of the two signals on inputs 203 and 205 is at least one threshold voltage below VCC, the sense amplifier will function properly.

Figure 3:
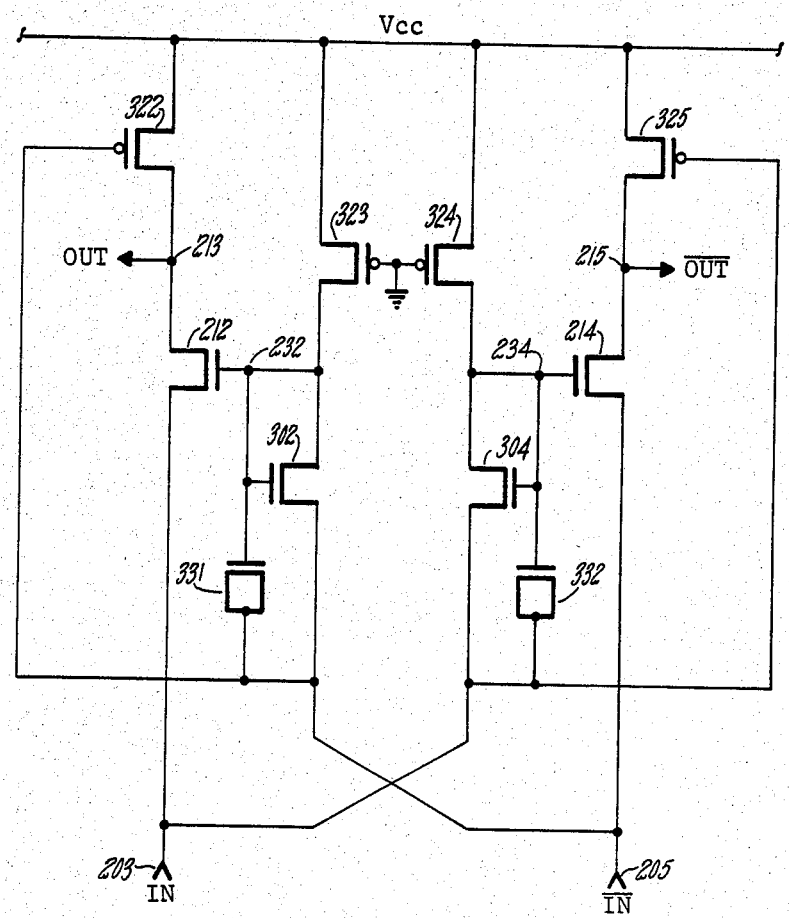
FIG. 3 illustrates an embodiment of the invention employing CMOS circuits.

A specific embodiment of the invention which employs CMOS technology is shown in FIG. 3, which is designed to have a differential gain of 3 to 6 with a delay of approximately 1 nanosecond. Parameters for this embodiment were a VCC voltage of 5 volts, a transistor threshold voltage of 0.8 volts and a range for the input signals of between 2.4 and 2.6 volts. In FIG. 3, transistors that are the same as those of FIG. 2 are given the same numeral and elements that perform similar functions are given numerals that increase by 100 from the numeral of FIG. 2. The amplifying transistors 212 and 214 are connected as before to level shifting transistors 302 and 304 which are an embodiment of level-shifting networks 202 and 204. There is a MOS capacitor 331 connected between the input signal line 205 and the gate of transistor 302. There is also an MOS capacitor 332 connected between input 203 and the gate of transistor 304. These capacitors are used to improve the speed with which the input signals reach the gates of the amplifying transistors 212 and 214. They are formed conventionally by using the gate of an MOS transistor as one terminal and the source and drain as the other terminal. Their capacitance should dominate the stray capacitance of nodes 232 and 234 at the gates of transistors 212 and 214, respectively.

The resistors of FIG. 2 have been replaced by P-channel transistors 322, 323, 324, and 325 which function as load resistors in order to bias the amplifying transistors and level shifters. The gates of transistors 323 and 324 are tied to ground, but the gates of transistors 322 and 325 are connected to the input signal on the opposite column line, thus increasing the gain of the sense amplifier even further. Two versions of biasing have been shown in FIGS. 2 and 3. Any of a number of biasing circuits or devices may be used, such as an N-channel transistor with its gate connected to VCC, et cetera.

Figure 4:
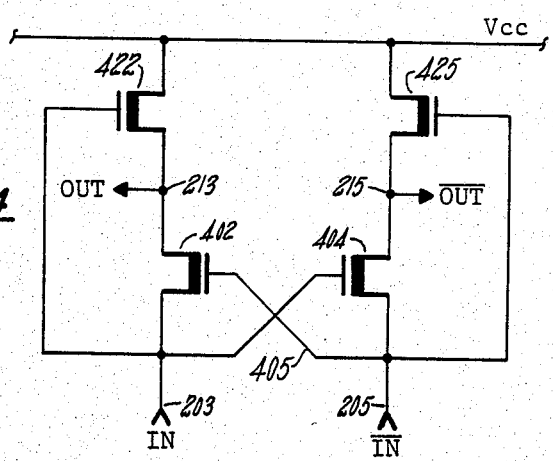
FIG. 4 illustrates an embodiment of the invention implemented using N-channel depletion transistors.

If the processing steps available include the fabrication of depletion-mode transistors, it is possible to simplify the circuit by eliminating the level shift networks 202 and 204 and employing depletion-mode transistors that have a threshold slightly below 0 volts. In this case, the circuit of FIG. 4 may be used. Input 203 is connected directly to the gate of transistor 404, eliminating the need for level shifting. Similarly, input 205 is connected directly to the gate of amplifying transistor 402. The differential nature of the invention can be seen very clearly in this figure, in a case where input line 203 is rising and input line 205 is falling. The signal on the gate of transistor 404 will rise at the same time that the signal on the source of transistor 404 falls, thus increasing the gate to source voltage of this transistor. Conversely, the voltage on the gate of transistor 402 will fall at the same time that the voltage on the source of transistor 402 rises, thus decreasing the gate to source voltage. The gates of load devices 422 and 425 are connected to the input lines 203 and 205, respectively, which serves to increase the amplifier gain still further. In FIG. 4, depletion-mode transistors 422 and 425, are used and in FIG. 3, p-channel enhancement made transistors are used together with n-channel transistors for the remainder. Transistors 322 and 325 could be n-channel with the remainder p-channel, if desired.

The sense amplifier of the present invention is not limited to static random access memories, however, but may be applied to any circuit that requires differential amplification of signals which are presented on relatively high-capacitance nodes. One such application would be to a dynamic random access memory in which the column circuitry is designed to be fully static. Such an arrangement of appropriate column circuitry is illustrated in Baba, Fumio, et al, "A 35ns Static Column DRAM", 1983 *IEEE ISSCC Digest of Technical Papers*, pages 64–65. The invention is not limited to a CMOS application, but may be readily applied by those skilled in the art to NMOS, PMOS, or bipolar circuits with the straightforward substitution of the appropriate polarity transistors and diodes.

The connection between one of the input lines and the gate of the amplifying transistor will be referred to by the generic term "signal transfer means". For example, in FIG. 2, the signal transfer means between the gate of transistor 212 and line 205 is the path through level-shifting network 202. In FIG. 3, the signal transfer means is both the path through capacitor 331 and through transistor 302. In FIG. 4, the signal transfer means is simply the connecting lead 405 between line 205 and depletion-mode transistor 402.

I claim:

1. A sense amplifier, having a gain greater than one, for sensing the relative voltage of a pair of input signals on a pair of input terminals, comprising:
   first and second amplifier transistors, each having a source terminal connected to one of said pair of input terminals and a drain terminal, that is also one of first and second output terminals, connected to a bias means for biasing said drain terminal, that is in turn connected to a supply voltage terminal;
   each of which amplifier transistors has a gate terminal connected to a gate voltage means for controlling said gate terminal; characterized in that:
   each of said gate terminal of said first and second amplifying transistors is connected through first and second level-shifting network means to the source terminal of the other of said first and second amplifier transistors, whereby that signal present on each of said pair of input terminals is applied to the gate of one of said amplifier transistors at a first gate voltage and to the source of the other of said amplifier transistors at a first source voltage.

2. A sense amplifier according to claim 1, in which said level-shifting network means comprises a capacitor connected in parallel with a diode-connected transistor, whereby capacitive coupling through said capacitor speeds up the transmission of input signals through said network.

3. A sense amplifier, having a gain greater than one, for sensing the relative voltage of a pair of input signals on a pair of input terminals, comprising:
   first and second amplifier transistors, each having a source terminal connected to one of said pair of input terminals and a drain terminal, that is also one of first and second output terminals, connected to a bias means for biasing said drain terminal, that is in turn connected to a supply voltage terminal;
   each of which amplifier transistors has a gate terminal connected to a gate voltage means for controlling said gate terminal; characterized in that:
   each of said gate terminal of said first and second amplifying transistors is connected through signal transfer means to the source terminal of the other of said first and second amplifier transistors, whereby that signal present on each of said pair of input terminals is applied to both the gate of one of said amplifier transistors and to the source of the other of said amplifier transistors; and
   said first and second amplifier transistors are MOSFETs; and each of said bias means for said first and second transistors comprises a bias MOSFET transistor having a first bias terminal connected to said drain terminal of one of said first and second amplifier transistors, a second terminal connected to a supply voltage and a bias gate terminal connected to said source terminal of the other of said first and second amplifier transistors.

4. A sense amplifier according to claim 3, in which each of said bias MOSFET transistors is a P-channel transistor.

5. A sense amplifier according to claim 3, in which each of said bias MOSFET transistors is an enhancement transistor.

* * * * *